(12) United States Patent
Li et al.

(10) Patent No.: US 11,093,091 B2
(45) Date of Patent: Aug. 17, 2021

(54) DISPLAY PANEL

(71) Applicant: Shanghai Tianma AM-OLED Co., Ltd., Shanghai (CN)

(72) Inventors: Jieliang Li, Xiamen (CN); Yuheng Zhang, Xiamen (CN); Feng Lu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 17/006,894

(22) Filed: Aug. 31, 2020

(65) Prior Publication Data

US 2020/0393924 A1    Dec. 17, 2020

(30) Foreign Application Priority Data

Jun. 17, 2020    (CN) .......................... 202010554327.9

(51) Int. Cl.
| | | |
|---|---|---|
| *G06F 3/044* | (2006.01) | |
| *G02F 1/1368* | (2006.01) | |
| *G02F 1/1333* | (2006.01) | |
| *H01L 27/12* | (2006.01) | |
| *G02F 1/1343* | (2006.01) | |
| *G02F 1/1362* | (2006.01) | |
| *H01L 27/32* | (2006.01) | |

(52) U.S. Cl.
CPC .... *G06F 3/044* (2013.01); *G06F 2203/04105* (2013.01)

(58) Field of Classification Search
USPC ......................................................... 345/173
See application file for complete search history.

(56) References Cited

U.S. PATENT DOCUMENTS

| | | | | |
|---|---|---|---|---|
| 2014/0313430 | A1* | 10/2014 | Bui ........................ | G06F 3/0421 349/12 |
| 2016/0026315 | A1* | 1/2016 | Choi ...................... | G06F 3/0445 345/174 |
| 2017/0338294 | A1* | 11/2017 | Choi .................... | H01L 27/3276 |
| 2018/0040674 | A1* | 2/2018 | Du ....................... | H01L 27/3248 |
| 2018/0052350 | A1* | 2/2018 | Zhao .................... | G02F 1/13338 |
| 2018/0129330 | A1* | 5/2018 | Ding .................... | G06F 3/0446 |
| 2018/0129331 | A1* | 5/2018 | Zhou ................... | H01L 27/1288 |
| 2018/0129343 | A1* | 5/2018 | Zhai .................... | G06F 3/04142 |
| 2019/0004659 | A1* | 1/2019 | Bian ....................... | G06F 3/041 |
| 2020/0393936 | A1* | 12/2020 | Bok ....................... | G06F 3/0443 |

FOREIGN PATENT DOCUMENTS

CN          109728049 A          5/2019

* cited by examiner

*Primary Examiner* — Chineyere D Wills-Burns
(74) *Attorney, Agent, or Firm* — Kilpatrick Townsend & Stockton, LLP

(57) ABSTRACT

A display panel is provided. The display panel includes a display area and a border area. The display area includes multiple display units. The border area includes a drive circuit and at least one pressure detection element. A drive signal is provided by the drive circuit to the display units. The pressure detection element and the drive circuit are arranged in different layers. The pressure detection element is used to detect a pressure signal in the display panel.

15 Claims, 22 Drawing Sheets

DISPLAY PANEL

CROSS-REFERENCE TO RELATED APPLICATIONS

The present application claims priority to Chinese Patent Application No. 202010554327.9, titled "DISPLAY PANEL", filed on Jun. 17, 2020 with the China National Intellectual Property Administration, which is incorporated herein by reference in its entirety.

FIELD

The present disclosure relates to the field of display, and in particular to a display panel.

BACKGROUND

With the development of touch technology, more display panels are integrated with pressure detection to detect a pressure on a surface of the display panel. However, a border area of the existing display panel integrated with a pressure detection function is quite large, and it is difficult to adapt to a development trend of narrow bezel.

SUMMARY

A display panel is provided according to embodiments of the present disclosure to reduce a thickness of a border area of the display panel for the development trend of narrow bezel.

A display panel includes a display area and a border area. The display area includes multiple display units. The border area includes a drive circuit and at least one pressure detection element. The drive circuit is configured to provide a drive signal to the display units. The pressure detection element and the drive circuit are arranged in different layers. The pressure detection element is configured to detect a pressure signal in the display panel.

In the display panel according to the embodiment of the present disclosure, the pressure detection element and the drive circuit are arranged in different layers. In a case that the pressure detection element is arranged in the border area of the display panel, the pressure detection element and the drive circuit may be arranged to be laminated, so that the display panel is integrated with a pressure detection function with reducing the impact of the arrangement of the pressure detection element on the width of the border area of the display panel. In this way, the border area of the display panel is quite narrow, which may adapt to the development trend of narrow bezel.

BRIEF DESCRIPTION OF THE DRAWINGS

The drawings to be used in the description of the embodiments will be described briefly as follows. It is apparent that the drawings in the following description only illustrate some embodiments of the present disclosure.

DETAILED DESCRIPTION

Hereinafter, according to embodiments of the present disclosure are explained clearly and completely in conjunction with the drawings in the embodiments of the disclosure. It is apparent that the embodiments in the following description are only some embodiments of the present disclosure, rather than all of the embodiments.

The details will be described as follows, so that the present disclosure is fully understood. The present disclosure may be implemented in other ways different from those described herein.

As described in the background, the existing display panel with a pressure detection function has a large border area, which is difficult to adapt to the development trend of narrow bezel.

Figure 1:
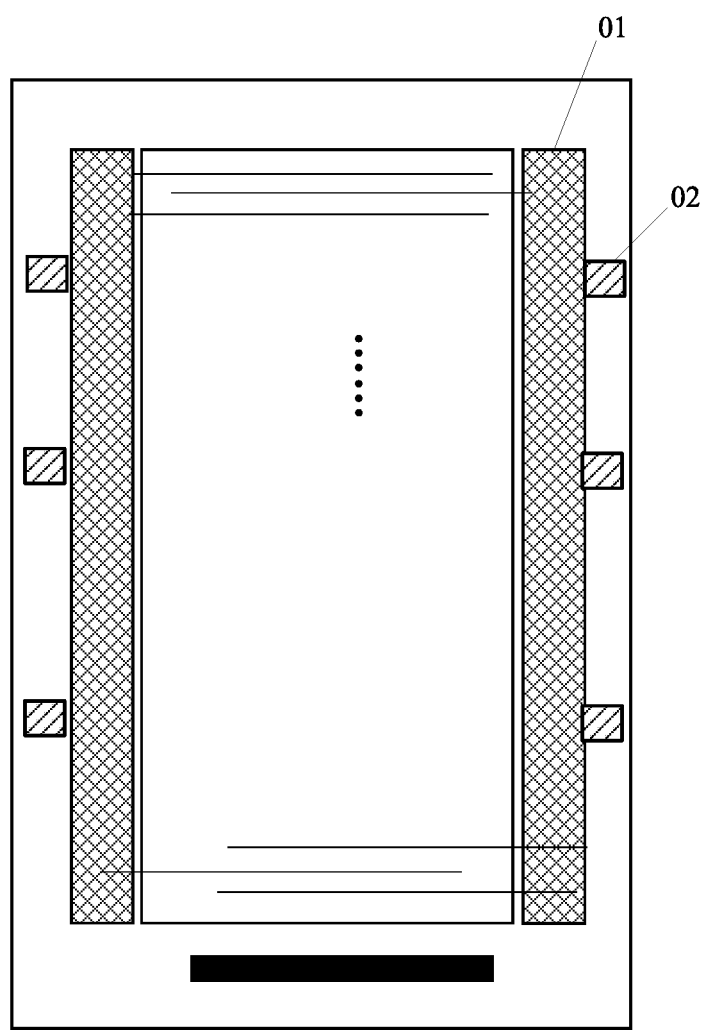
FIG. 1 is a schematic diagram shows a relative position between a gate drive circuit and a pressure detection element in a display panel according to the conventional technology.

The study found that, in the existing display panel, the pressure detection element for pressure detection is made of polysilicon, which is the same as the material used to make a channel of a thin film transistor in a gate drive circuit. Therefore, as shown in FIG. 1, a pressure detection element 02 and a gate drive circuit 01 are commonly arranged in parallel in the same layer of the existing display panel, which results in that the border area of the display panel integrated with the pressure detection function is quite large.

Figure 2:
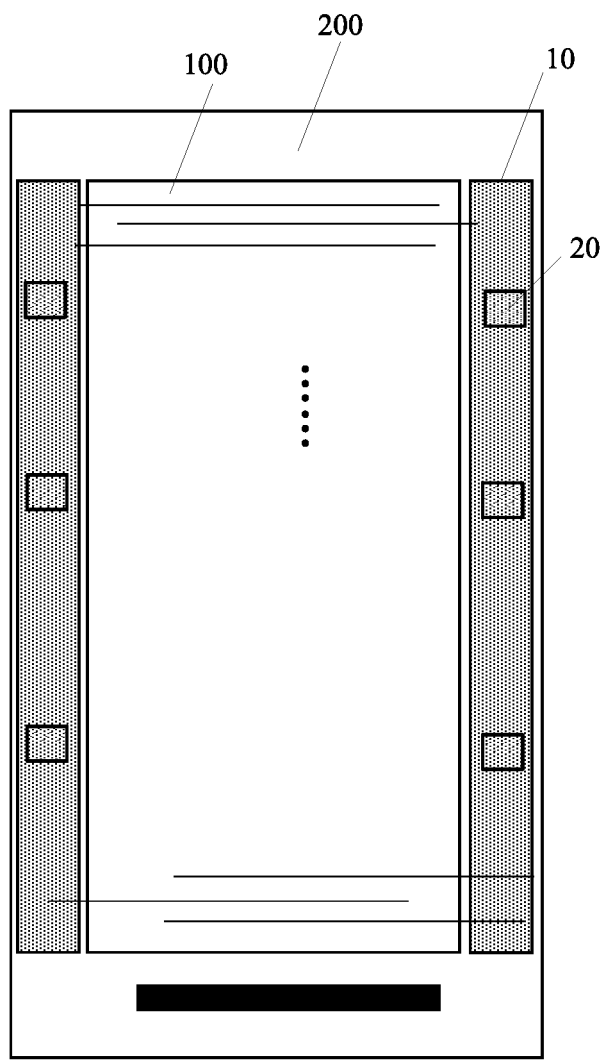
FIG. 2 is a schematic diagram shows a relative position between a drive circuit and a pressure detection element in a display panel according to an embodiment of the present disclosure.

In view of this, a display panel is provided according to embodiments of the present disclosure. As shown in FIG. 2, the display panel includes a display area 100 and a border area 200. The display area 100 includes multiple display units (not shown in the figure), the display area 100 is surrounded by the border area 200. The border area 200 includes a drive circuit 10 and at least one pressure detection element 20. The drive circuit 10 is configured to provide a drive signal to the display units, to drive the display units to display an image. The pressure detection element 20 and the drive circuit 10 are arranged in different layers. The pressure detection element is configured to detect a pressure signal in the display panel. In one embodiment, in the embodiment of the present disclosure, the drive circuit 10 includes a gate drive circuit.

It can be seen that, according to the embodiment of the present disclosure, the pressure detection element and the drive circuit are arranged in different layers. In a case that the pressure detection element is arranged in the border area of the display panel, the pressure detection element and the drive circuit may be arranged to be laminated, so that the display panel is integrated with a pressure detection function with reducing the impact of the arrangement of the pressure detection element on the width of the border area of the display panel. In this way, the border area of the display panel is quite narrow, which may adapt to the development trend of narrow bezel.

Figure 3:
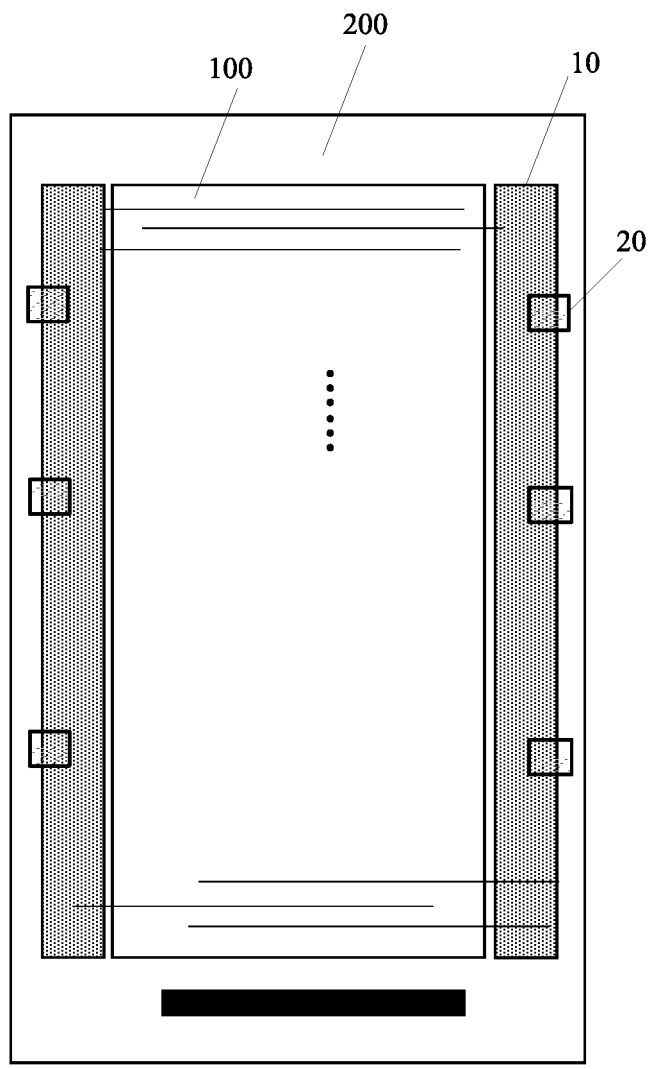
FIG. 3 is a schematic diagram shows a relative position between a drive circuit and a pressure detection element in a display panel according to another embodiment of the present disclosure.

Based on the above embodiment, in an embodiment of the present disclosure, as shown in FIG. 3, a projection of the pressure detection element 20 on a predetermined plane is at least partially overlapped with a projection of the drive circuit 10 on the predetermined plane. The impact of the arrangement of the pressure detection element 20 on the width of the border area 200 of the display panel is reduced by make the pressure detection element 20 and the drive circuit 10 to be laminated, which may realize a quite narrow border area 200 of the display panel for the development trend of narrow bezel. The predetermined plane is parallel to a display surface of the display panel.

In one embodiment, in an embodiments of the present disclosure, as shown in FIG. 2, the projection of the pressure detection element 20 on the predetermined plane is within the projection of the drive circuit 10 on the predetermined plane, so that the width of the border area 200 of the display panel is not increased due to the arrangement of the pressure detection element 20, which may realize a quite narrow border area 200 of the display panel for the development trend of narrow bezel.

Figure 4:
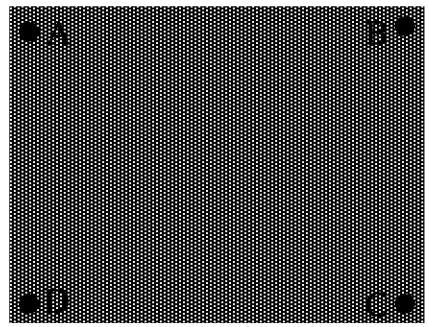
FIG. 4 is a schematic structural diagram of a pressure detection element in a display panel according to an embodiment of the present disclosure.

Based on any one of the above embodiments, in an embodiment of the present disclosure, the pressure detection element includes at least one detection resistor. The detection resistor and the drive circuit are arranged in different layers. In one embodiment, in an embodiment of the present disclosure, the pressure detection element includes one detection resistor. As shown in FIG. 4, different positions of the detection resistor are used as different electrical connection terminals to simplify the structure of the pressure detection element. The detection resistor includes a first connection terminal A, a second connection terminal B, a third connection terminal C and a fourth connection terminal D which are arranged at four corners of the detection resistor and which are arranged clockwise. The first connection terminal A and the third connection terminal C are used to receive an inputted voltage signal. The second connection terminal B and the fourth connection terminal D are used to detect change of a signal in the detection resistor.

Figure 5:
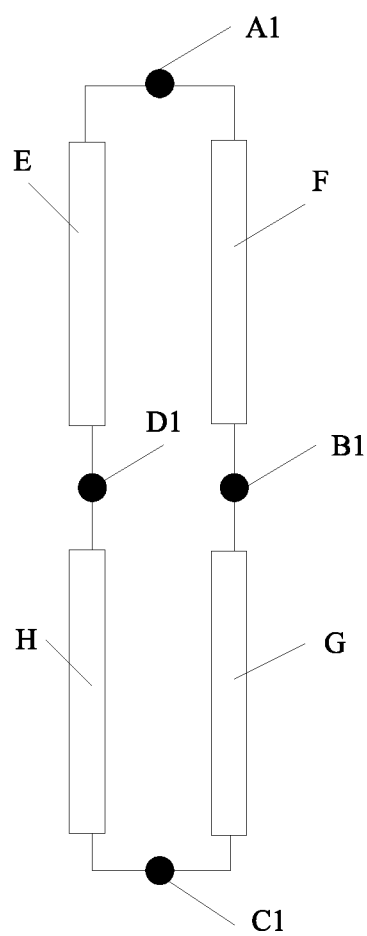
FIG. 5 is a schematic structural diagram of a pressure detection element in a display panel according to another embodiment of the present disclosure.

In another embodiment of the present disclosure, as shown in FIG. 5, the pressure detection element includes four detection resistors, which are a first detection resistor E, a second detection resistor F, a third detection resistor G and a fourth detection resistor H. The first detection resistor E, the second detection resistor F, the third detection resistor G and the fourth detection resistor H are connected end to end in order. A common terminal A1 between the first detection resistor E and the second detection resistor F and a common terminal C1 between the third detection resistor G and the fourth detection resistor H are used to receive an inputted voltage signal. A common terminal B1 between the second detection resistor F and the third detection resistor G and a common terminal D1 between the first detection resistor E and the fourth detection resistor H are used to detect change of a signal in the pressure detection element. It is not limited in the present disclosure, and it depends on the actual requirements.

The display panel provided according to the embodiment of the present disclosure is described as follows by taking a case, in which the pressure detection element includes one detection resistor and different positions of the detection resistor are used as different electrical connection terminals, as an example.

In one embodiment, in an embodiment of the present disclosure, the detection resistor has a square resistance of 1 kΩ to 4 kΩ, inclusive. In this way, both the sensitivity of the pressure detection element for pressure detection and the power consumption for the pressure detection in the display panel may be taken into account, on the basis that the detection resistor may be used to detect a pressure signal in the display panel.

Based on the above embodiment, in an embodiment of the present disclosure, the detection resistor is made of oxide semiconductor, such as IGZO (that is indium gallium zinc oxide), to reduce the square resistance of the detection resistor, which is not limited in the present disclosure, and it depends on the actual requirements.

Based on the above embodiment, in an embodiment of the present disclosure, a line width of the detection resistor is greater than 3 um, and a thickness of the detection resistor ranges from 30 A to 50 A, inclusive, so that the square resistance of the detection resistor is in the range of 1 kΩ to 4 kΩ, inclusive, which is not limited in the present disclosure, it depends on the actual requirements.

Figure 6:
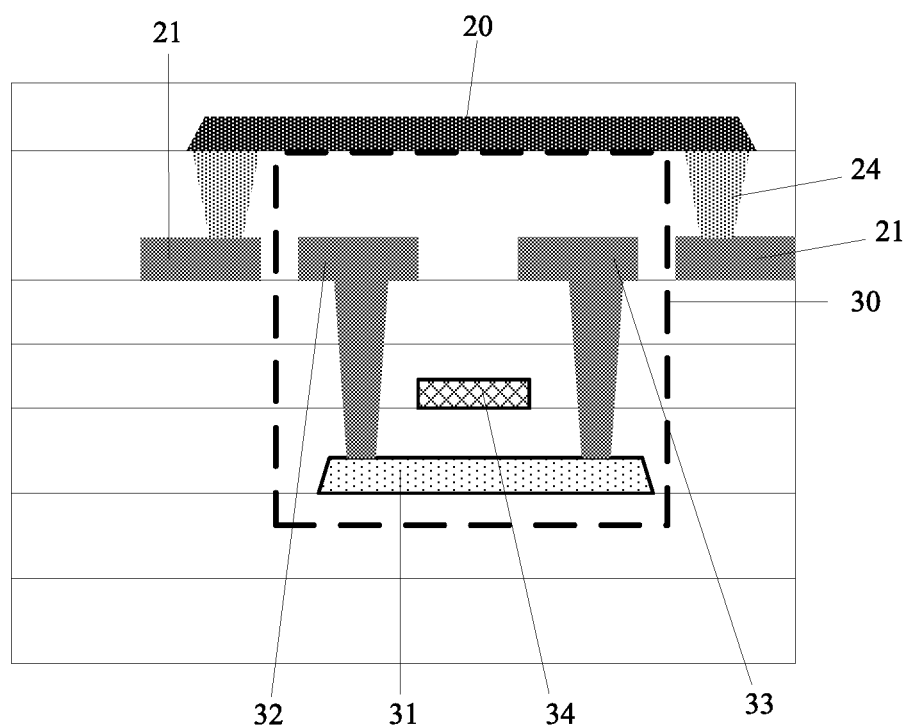
FIG. 6 is a partial section view of a position where a pressure detection element is arranged in a display panel according to an embodiment of the present disclosure.

Based on any of the above embodiments, in an embodiment of the present disclosure, the drive circuit includes multiple first thin film transistors. As shown in FIG. 6, the first thin film transistor 30 includes a first channel layer 31, a first source 32, a first drain 33 and a first gate 34. The first source 32 and the first drain 33 are electrically connected with the first channel layer 31. The first gate 34 is configured to control a conduction state of the first channel layer 31. The first channel layer 31 is a polysilicon channel layer. The detection resistor (that is the pressure detection element 20) is arranged on a side of the first source 32 and the first drain 33 which is away from the first channel layer 31. It should be understood that a layer where the first source 32 and the first drain 33 are arranged is different from a layer where the first gate 34 is arranged, and an interlayer insulation layer is arranged between the layer where the first source 32 and the first drain 33 are arranged and the layer where the first gate 34 is arranged. Similarly, the layer where the first gate 34 is arranged is different from a layer where the first channel layer 31 is arranged, and a gate insulation layer is arranged between the layer where the first gate 34 is arranged and the layer where the first channel layer 31 is arranged.

It should be noted that, in an embodiment of the present disclosure, the interlayer insulation layer between the layer where the first source 32 and the first drain 33 are arranged and the layer where the first gate 34 is arranged includes two laminated interlayer insulating layers, that is a first interlayer insulation layer and a second interlayer insulation layer, which is not limited in the present disclosure. In another embodiment of the present disclosure, the interlayer insulation layer between the layer where the first source 32 and the first drain 33 are arranged and the layer where the first gate 34 is arranged may include one interlayer insulating layer, which depends on the actual requirements.

Based on the above embodiment, in an embodiment of the present disclosure, as shown in FIG. 6, the display panel further includes a first connection line 21 configured to provide a voltage signal to the pressure detection element 20, and a first detection line (not shown in the figure) configured to detect change of a signal in the pressure detection element. In one embodiment, the first detection line and the first connection 21 are arranged in the same layer. Taking the location of the first connection line as an example, the display panel provided according to the embodiment of the present disclosure is described as follows.

Based on the above embodiment, in an embodiment of the present disclosure, the first connection line 21 is arranged in a same layer with the first source 32 or the first drain 33. Similarly, the first detection line is arranged in a same layer with the first source 32 or the first drain 33, so that the thickness of the display panel may be reduced.

Based on the above embodiment, in an embodiment of the present disclosure, as shown in FIG. 6, a projection of the pressure detection element 20 on a predetermined plane is at least partially overlapped with a projection of the first connection line 21 on the predetermined plane. In an area of the pressure detection element 20 and an area of the first connection line 21 which are corresponding to an area where the projection of the pressure detection element 20 on the predetermined plane is overlapped with the projection of the first connection line 21 on the predetermined plane, the pressure detection element 20 is directly electrically connected with the first connection line 21 via a first via-hole 24. It should be understood that the first via-hole 24 is a through-hole arranged in a passivation layer between the pressure detection element 20 and the first connection line 21.

Figure 7:
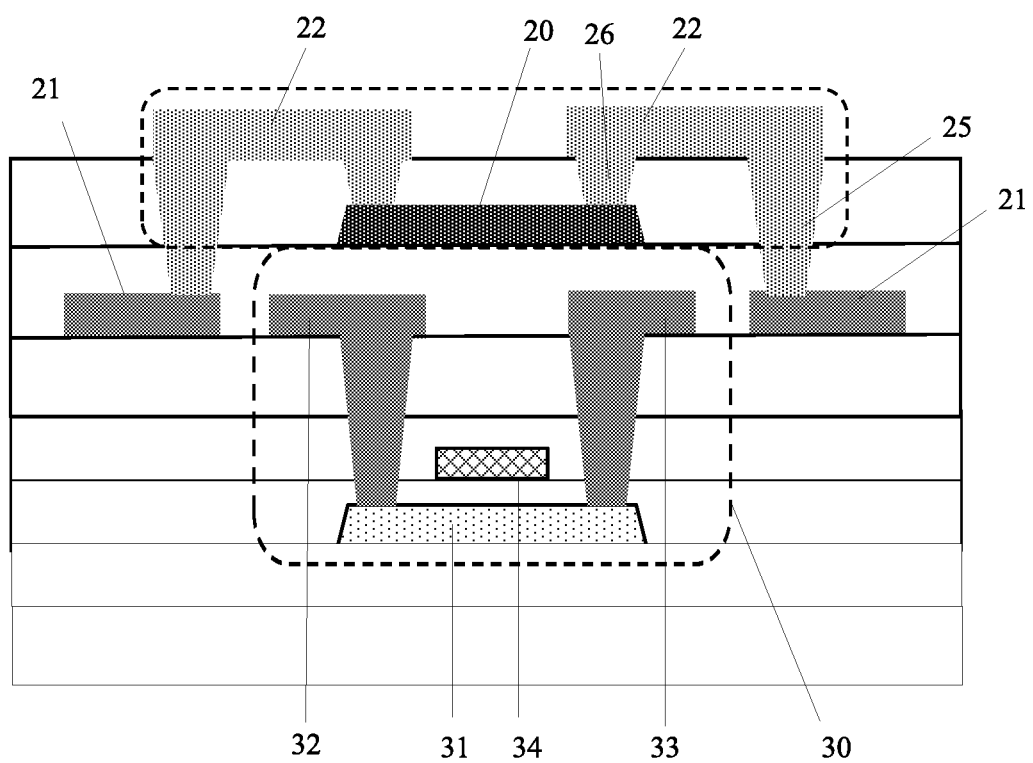
FIG. 7 is a partial section view of a position where a pressure detection element is arranged in a display panel according to another embodiment of the present disclosure.

In another embodiment of the present disclosure, as shown in FIG. 7, the display panel further includes a second connection line 22 configured to electrically connect the first connection line 21 with the pressure detection element 20. One end of the second connection line 22 is electrically connected with the first connection line 21 via a second via-hole 25. The other end of the second connection line 22 is electrically connected with the pressure detection element 20 via a third via-hole 26. That is, the first connection line 21 is electrically connected with the pressure detection element 20 via the second connection line 22 as a cross-bridge. It should be understood that, the third via-hole 26 is a through-hole arranged in a planarization layer between the pressure detection element 20 and the second connection line 22. The second via-hole 25 is a through-hole arranged in the planarization layer between the pressure detection element 20 and the second connection line 22 and arranged in a passivation layer between the second connection line 22 and the first connection line 21. That is, the second via-hole 25 penetrates through the planarization layer between the pressure detection element 20 and the second connection line 22 and the passivation layer between the second connection line 22 and the first connection line 21.

In one embodiment, based on the above embodiment, in some embodiments of the present disclosure, as shown in FIG. 7, the second connection line 22 is arranged a side of the pressure detection element 20 away from the first connection line 21. The second connection line 22 is arranged at a surface of the planarization layer covering the pressure detection element 20. The second connection line 22 is electrically connected with the pressure detection element 20 via the third via-hole 26 that penetrates through the planarization layer. It is not limited in the present disclosure, and it depends on the actual requirements.

It should be noted that, in a case that the pressure detection element is electrically connected with the first connection line via the second connection line, the display panel further includes a second detection line, and the pressure detection element is electrically connected with the first detection line via the second detection line. In one embodiment, the first detection line and the first connection line are located in the same layer, and the second detection line and the second connection line are located in the same layer.

Based on the above embodiment, in an embodiment of the present disclosure, the display area of the display panel further includes a touch detection element, so that the display panel has a touch detection function. In the embodiment of the present disclosure, the touch detection element includes multiple touch electrodes for detecting a touch signal in the display panel. In one embodiment, in the embodiment of the present disclosure, the second connection line and at least a part of the multiple touch electrodes are located in the same layer, which may prevent increase of thickness of the display panel due to the arrangement of the second connection line.

Based on the above embodiment, in an embodiment of the present disclosure, the touch detection of the display panel is a mutual capacitance touch detection. The multiple touch electrodes include multiple drive electrodes and multiple sense electrodes. The drive electrodes are arranged in a layer different from a layer where the sense electrodes are arranged. In the embodiment of the present disclosure, the second connection line and the drive electrodes are arranged in the same layer, or the second connection line and the sense electrodes are arranged in the same layer, which is not limited in the present disclosure. In other embodiments of the present disclosure, one part of the second connection line and the drive electrodes may be arranged in the same layer, and the other part of the second connection line and the sense electrodes may be arranged in the same layer, it depends on the actual requirements.

In another embodiment of the present disclosure, the touch detection of the display panel is a self-capacitance touch detection, and the multiple touch electrodes include multiple self-capacitance touch electrodes. In the embodiment of the present disclosure, the second connection line and the self-capacitance touch electrodes are arranged in the same layer.

It should be noted that, in any one of the above embodiments, the display panel may be Liquid Crystal Display (LCD) panel, or may be Organic Light Emitting Diode (OLED) display panel, description is made as follows in conjunction with the different situations.

Figure 8:
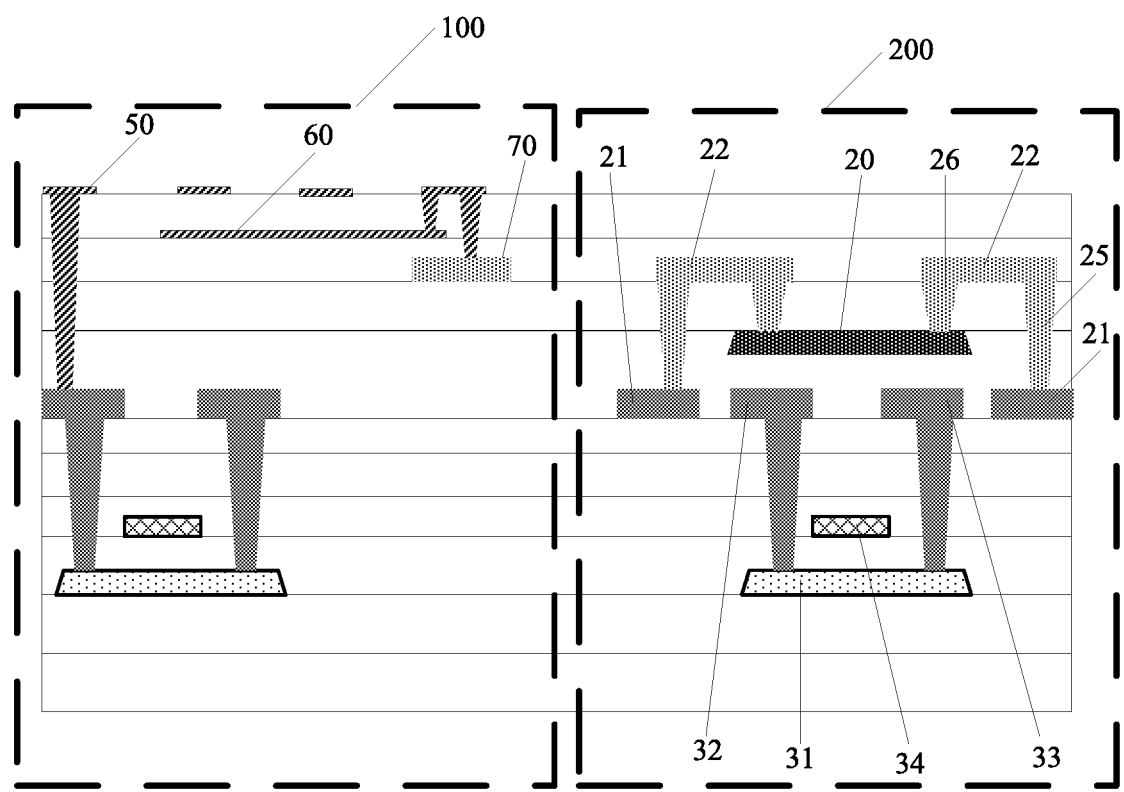
FIG. 8 is a partial section view of a display panel according to an embodiment of the present disclosure.

In the embodiment of the present disclosure, the display panel is an LCD display panel, as shown in FIG. 8, the display area 100 of the display panel further includes a common electrode layer and a pixel electrode layer. The pixel electrode layer includes multiple pixel electrodes 50. The pixel electrode 50 is electrically connected with the drain of the thin film transistor in the display area to transmit a data signal to the display unit. The common electrode layer includes multiple common electrodes 60 to provide a common voltage signal to each display unit.

It should be noted that, in the embodiment of the present disclosure, a first insulation layer is arranged between the common electrode layer and the pixel electrode layer to electrically insulate the common electrode 60 and the pixel electrode 50. It is not limited in the present disclosure, in other embodiments of the present disclosure, the common electrode layer and the pixel electrode layer may be arranged in the same layer, as long as the common electrode 60 and the pixel electrode 50 are electrically insulated.

It is also to be noted that, in the embodiment of the present disclosure, the display area of the display panel further includes multiple common electrode lines 70. The common electrode line 70 is electrically connected with the common electrode 60 to provide a common voltage signal to the common electrode. In one embodiment, in the embodiment of the present disclosure, a second insulation layer is arranged between the common electrode line 70 and the common electrode 60. The common electrode line 70 is electrically connected with the common electrode 60 via a cross-bridge. One end of the cross-bridge is electrically connected with the common electrode 60 via a via-hole arranged in the first insulation layer, and the other end of the cross-bridge is electrically connected with the common electrode line 70 via a via-hole penetrating through the first insulation layer and the second insulation layer.

In one embodiment, based on the above embodiment of the present disclosure, in an embodiment of the present disclosure, as shown in FIG. 8, the common electrode line 70 provides a common voltage signal to the common electrode 60 in a first time period, so that the common electrode 60 cooperates with the pixel electrode 50 to control the display unit to display. The common electrode line 70 provides a touch detection signal to the common electrode 60 in a second time period, to realize the touch detection by using the common electrode 60. In this way, the common electrode may further serve as the touch electrode, to reduce the thickness of the display panel with ensuring the display panel to have the touch function.

Based on the above embodiment, in an embodiment of the present disclosure, as shown in FIG. 8, the common electrode line 70 in the display area 100 and the second connection line 22 in the border area 200 are arranged in the same layer, to further reduce the thickness of the display panel.

Figure 9:
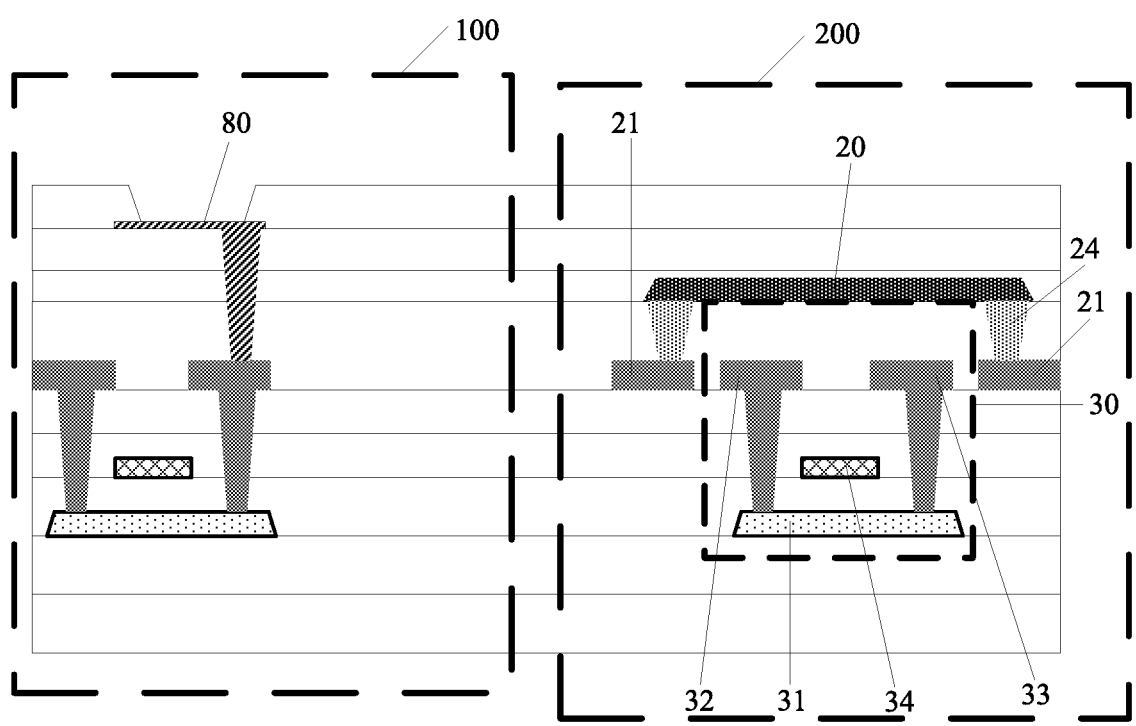
FIG. 9 is a partial section view of a display panel according to another embodiment of the present disclosure.

In a case that an OLED display panel is integrated with the touch function, the touch electrode mostly has on-cell structure. In an embodiment of the present disclosure, as shown in FIG. 9, when the display panel is an OLED display panel, the pressure detection element 20 is directly electrically connected with the first connection line 21 via a via-hole to reduce the thickness of the display panel, which is not limited in the present disclosure, and it depends on the actual requirements. It should be noted that, in the embodiment of the present disclosure, the display area 100 of the display panel further includes an anode 80. The anode 80 is electrically connected with the drain of the thin film transistor in the display area 100 via a via-hole to control the luminous display of a luminescent layer in the region where the anode 80 is arranged. It should be understood that in the embodiment of the present disclosure, a layer where the pressure detection element 20 is arranged is different from a layer where the first connection line 21 is arranged, and a passivation layer is arranged between the pressure detection element 20 and the first connection line 21. The pressure detection element 20 is electrically connected with the first connection line 21 via a via-hole arranged in the planarization layer. The layer where the anode 80 is arranged is different from a layer where the drain of the thin film transistor in the display area 100 is arranged. The layer where the drain of the thin film transistor in the display area 100 is arranged is the same as the layer where the first connection line 21 is arranged. A passivation layer and a planarization layer are arranged between the layer where the anode 80 is arranged and the layer where the drain of the thin film transistor in the display area 100 is arranged. The anode 80 is electrically connected with the drain of the thin film transistor via the via-hole which successively penetrates through the planarization layer and the passivation layer.

Based on any one of the above embodiments, in an embodiment of the present disclosure, the drive circuit includes a shift register circuit. The shift register circuit is arranged in the border area of the display panel, and the shift register circuit is configured to output a control signal for controlling display states of the multiple display units in the display area.

In one embodiment, in an embodiment of the present disclosure, the first connection line is configured to: provide the voltage signal to the pressure detection element in a first time period, and provide a control signal to the shift register circuit in a second time period. That is, in the display panel according to the embodiment of the present disclosure, a control signal line of the shift register circuit further serves as the first connection line, to reduce the number of lines and the wiring difficulty in the display panel.

In an embodiment of the present disclosure, the first connection line may be a high-level signal line VGH, a low-level signal line VGL, a clock signal line CK or an initial trigger signal line STV of the shift register circuit, which is not limited in the present disclosure, and it depends on the actual requirements.

It should be noted that, in the display panel, when the control signal line of the shift register circuit further serves as the first connection line, a third thin film transistor is arranged between the first connection line and the pressure detection element. One first connection line corresponds to one third thin film transistor. The first connection line is electrically connected with the source or drain of the third thin film transistor corresponding to the first connection line.

In a case that the pressure detection element is directly electrically connected with the third thin film transistor via a via-hole, as shown in FIG. 10 to FIG. 13, in the embodiment of the present disclosure, the third thin film transistor 40 includes a third channel layer 41, a third source 42, a third drain 43 and a third gate 44. The third source 42 and the third drain 43 are electrically connected with the third channel layer 41. The third gate 44 is configured to control a conduction state of the third channel layer 41. It should be understood, in the embodiment of the present disclosure, a layer where the third channel layer 41 is arranged is different from a layer where the third gate 44 is arranged, and a gate insulation layer is arranged between the third channel layer 41 and the third gate 44. A layer where the third source 42 and the third drain 43 are arranged is different from the layer where the third gate 44 is arranged, and an interlayer insulation layer is arranged between the layer where the third source 42 and the third drain 43 are arranged and the layer where the third gate 44 is arranged. The third source 42 and the third drain 43 are electrically connected with the third channel layer 41 via a via-hole successively penetrating through the interlayer insulation layer and the gate insulation layer.

It should be noted that, in an embodiment of the present disclosure, the interlayer insulation layer between the layer where the third source 42 and the third drain 43 are arranged and the layer where the third gate 44 is arranged includes two laminated interlayer insulating layers, that is a first interlayer insulation layer and a second interlayer insulation layer, which is not limited in the present disclosure. In another embodiment of the present disclosure, the interlayer insulation layer between the layer where the third source 42 and the third drain 43 are arranged and the layer where the third gate 44 is arranged may include one interlayer insulating layer, which depends on the actual requirements.

Figure 10:
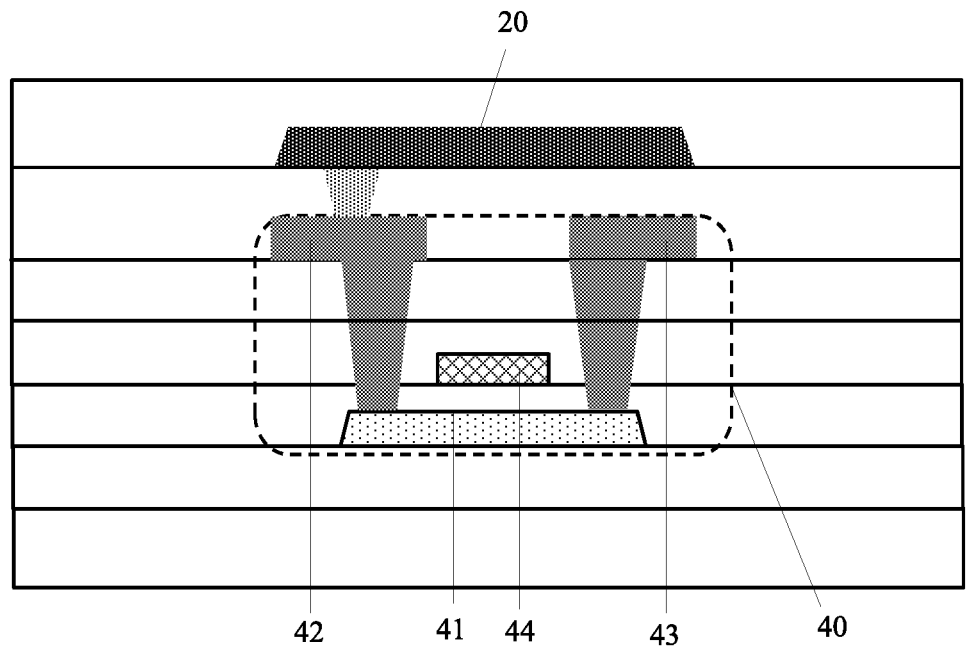
FIG. 10 is a partial section view of a position where a pressure detection element is arranged in a display panel according to another embodiment of the present disclosure.
Figure 11:
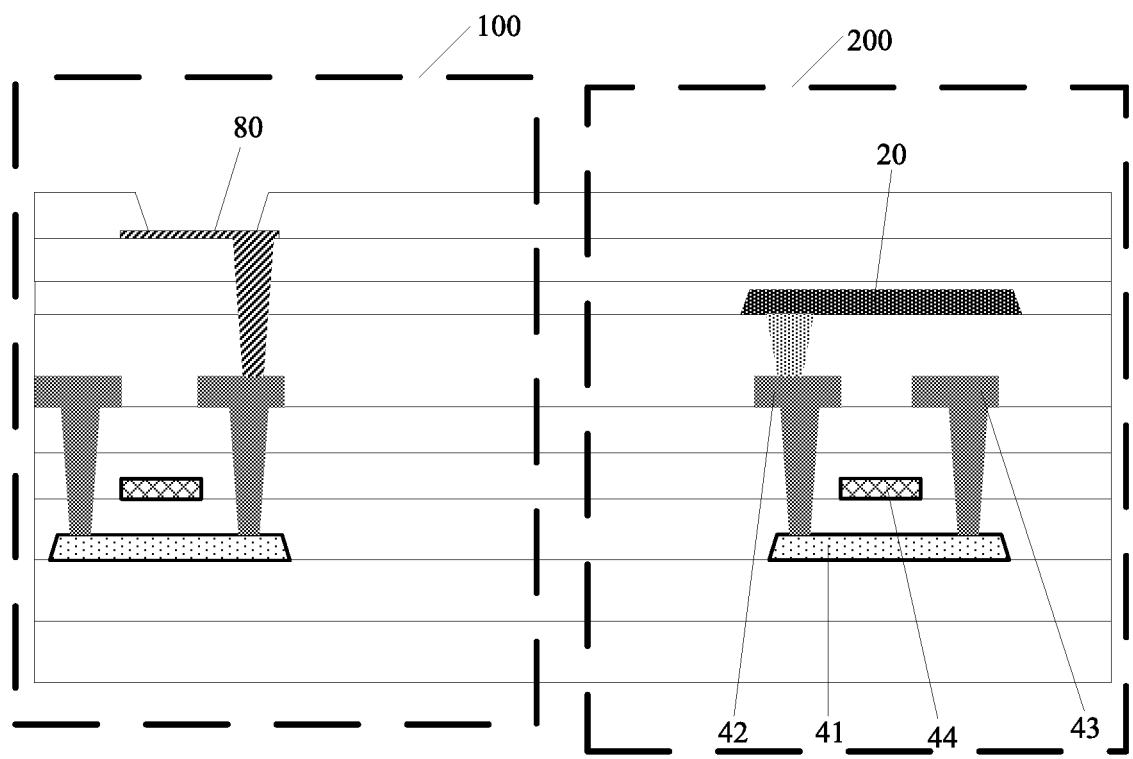
FIG. 11 is a partial section view of a display panel according to another embodiment of the present disclosure.
Figure 12:
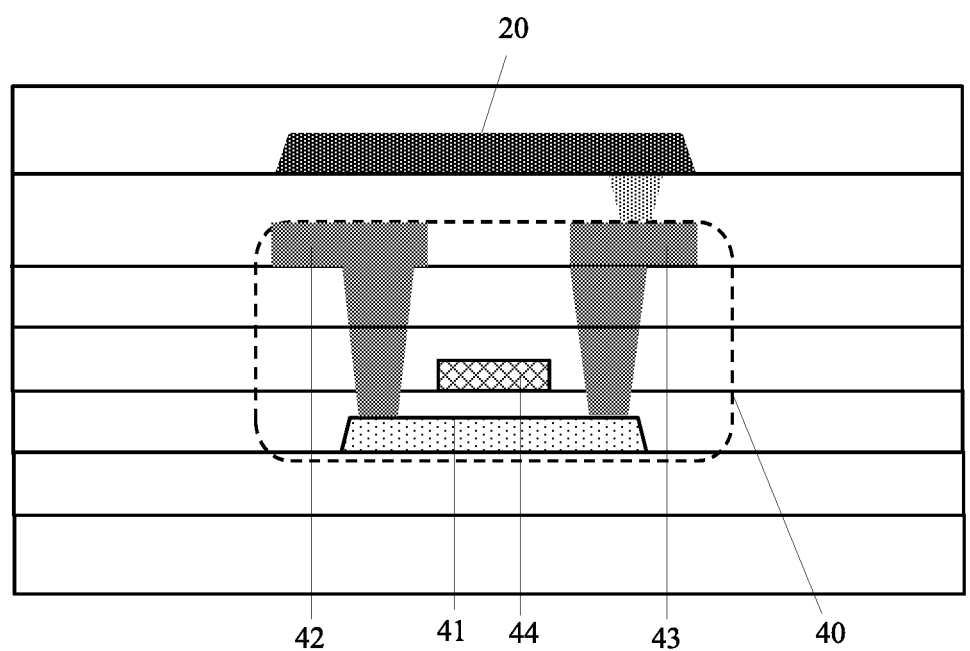
FIG. 12 is a partial section view of a position where a pressure detection element is arranged in a display panel according to another embodiment of the present disclosure.
Figure 13:
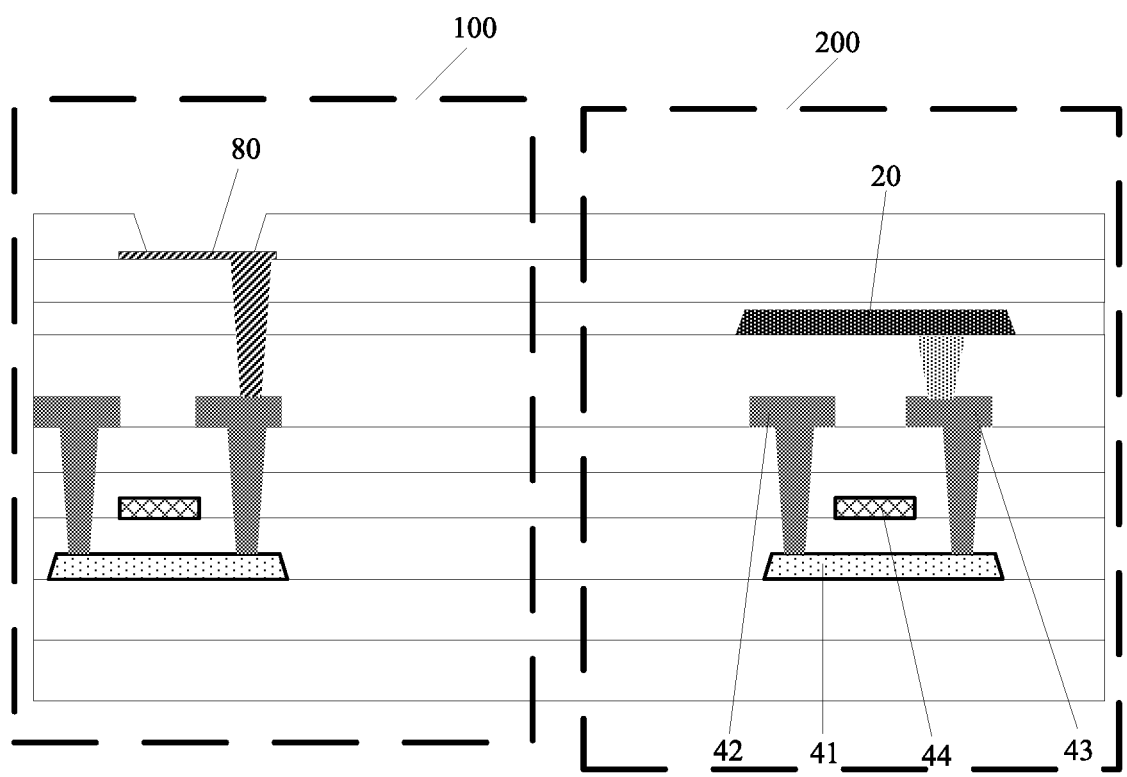
FIG. 13 is a partial section view of a display panel according to another embodiment of the present disclosure.

Based on the above embodiment, in an embodiment of the present disclosure, as shown in FIG. 10 and FIG. 11, the pressure detection element 20 is electrically connected with the third source 42 of the third thin film transistor 40 via a via-hole, so that the pressure detection element 20 is electrically connected with the control signal line of the shift register circuit via the third thin film transistor 40. In another embodiment of the present disclosure, as shown in FIG. 12 and FIG. 13, the pressure detection element 20 is electrically connected with the third drain 43 of the third thin film transistor 40 via a via-hole, and so that the pressure detection element 20 is electrically connected with the control signal line of the shift register circuit via the third thin film transistor 40.

Figure 14:
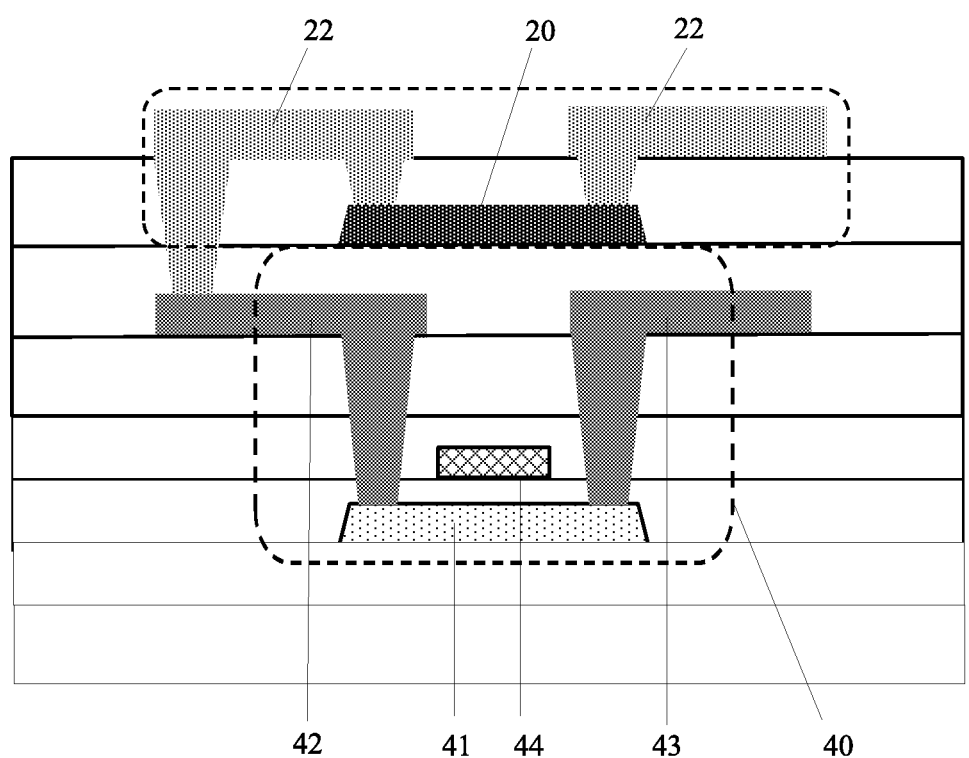
FIG. 14 is a partial section view of a position where a pressure detection element is arranged in a display panel according to another embodiment of the present disclosure.
Figure 15:
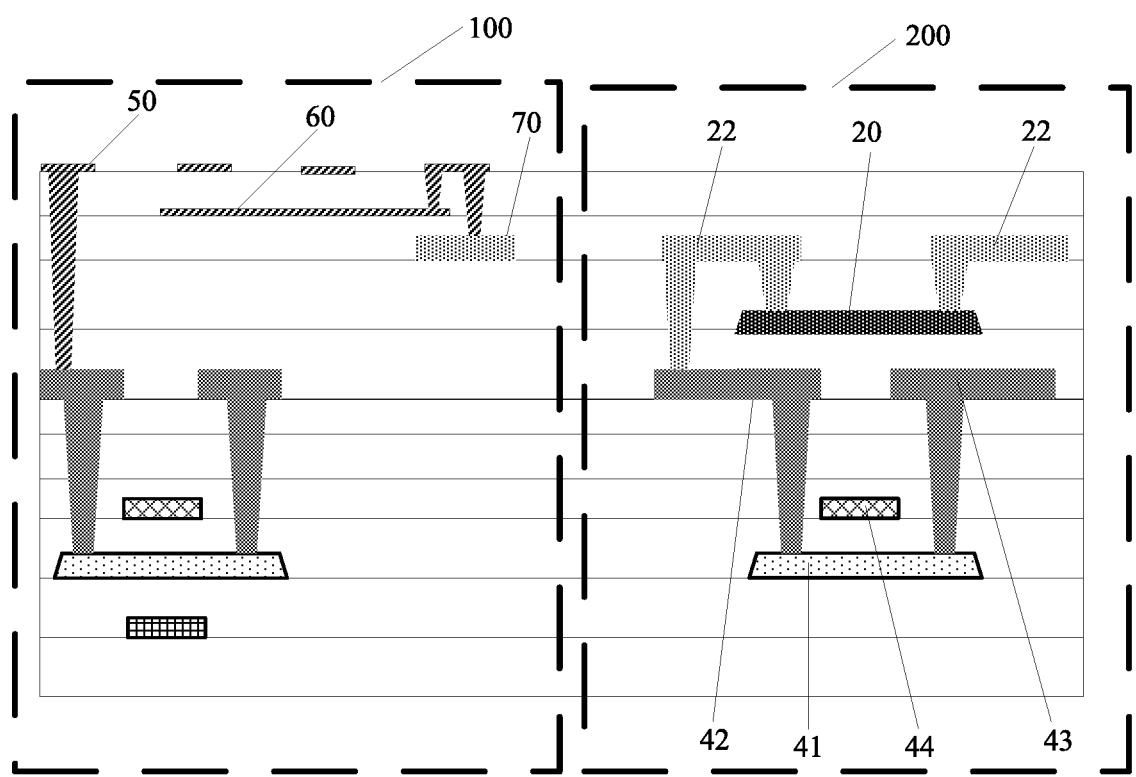
FIG. 15 is a partial section view of a display panel according to another embodiment of the present disclosure.
Figure 16:
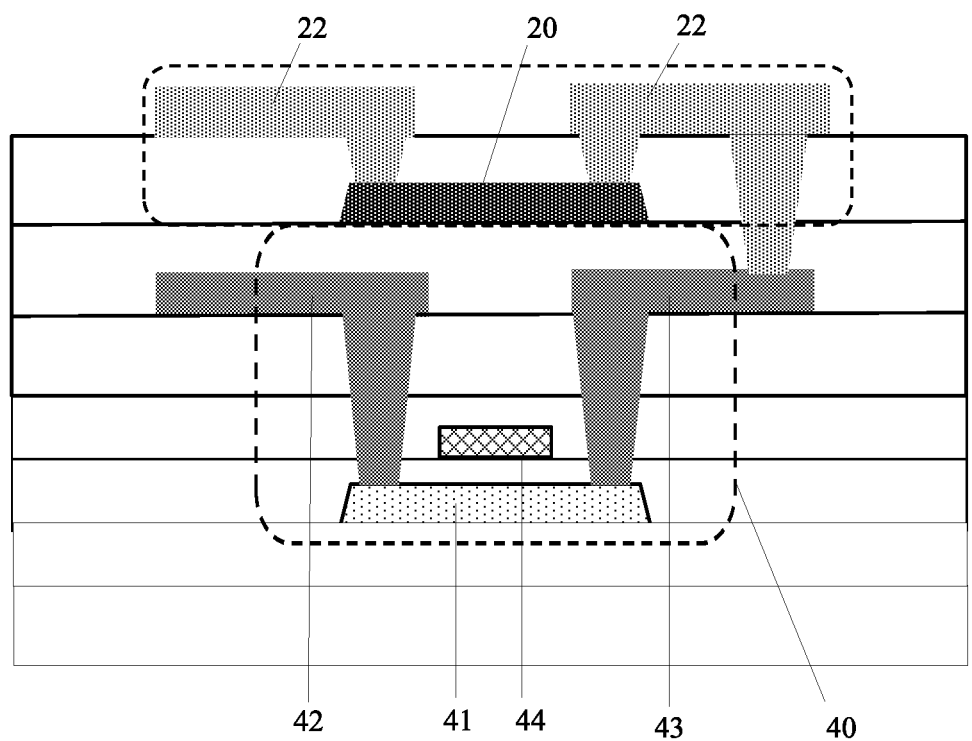
FIG. 16 is a partial section view of a position where a pressure detection element is arranged in a display panel according to another embodiment of the present disclosure.
Figure 17:
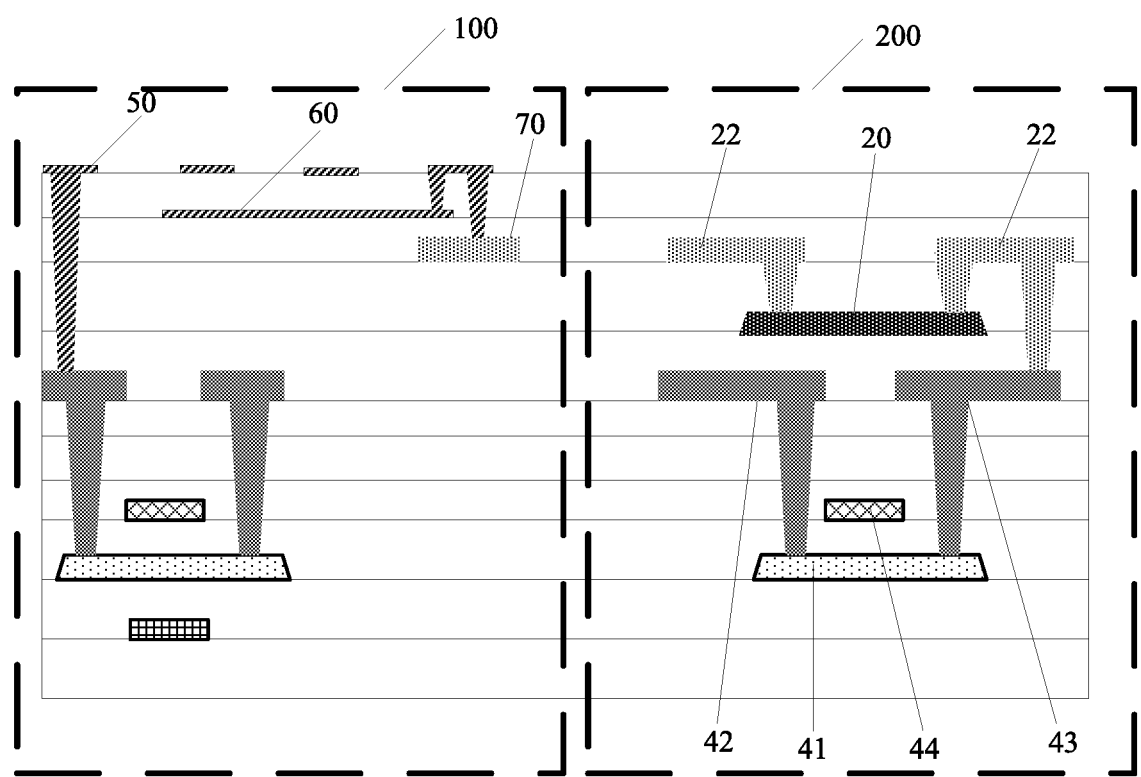
FIG. 17 is a partial section view of a display panel according to another embodiment of the present disclosure.

In a case that the pressure detection element is electrically connected with the third thin film transistor via the second connection line, as shown in FIG. 14 to FIG. 17, in the embodiment of the present disclosure, the third thin film transistor 40 includes a third channel layer 41, a third source 42, a third drain 43 and a third gate 44. The third source 42 and the third drain 43 are electrically connected with the third channel layer 41. The third gate 44 is configured to control a conduction state of the third channel layer 41. In the embodiment of the present disclosure, as shown in FIG. 14 and FIG. 15, the pressure detection element 20 is electrically connected with the second connection line 22 via a via-hole, and the second connection line 22 is electrically connected with the third source 42 of the third thin film transistor 40 via a via-hole, so that the pressure detection element 20 is electrically connected with the control signal line of the shift register circuit via the third thin film transistor 40. In another embodiment of the present disclosure, as shown in FIG. 16 and FIG. 17, the pressure detection element 20 is electrically connected with the second connection line 22 via a via-hole, and the second connection line 22 is electrically connected with the third drain 43 of the third thin film transistor 40 via a via-hole, so that the pressure detection element 20 is electrically connected with the control signal line of the shift register circuit via the third thin film transistor 40.

In one embodiment, in the embodiment of the present disclosure, the third thin film transistors may be some first thin film transistors of multiple first thin film transistors included in the drive circuit, which is not limited in the present disclosure, and it depends on the actual requirements.

It should be noted that, in the above embodiments of the present disclosure, description is made by taking a case, in which the first connection line is arranged in a same layer with the first source or the first drain, as an example. However, the disclosure is not limited to the case that the first connection line is arranged in a same layer with the first source or the first drain. In other embodiments of the present disclosure, the first connection line may be arranged in a layer different from a layer where the first source or the first drain is arranged. In order to facilitate the differentiation, when a connection line providing a voltage signal for the pressure detection element is arranged in a layer different from the layer where the first source or the first drain is arranged, and the connection line is named the third connection line in the embodiment of the present disclosure.

Figure 18:
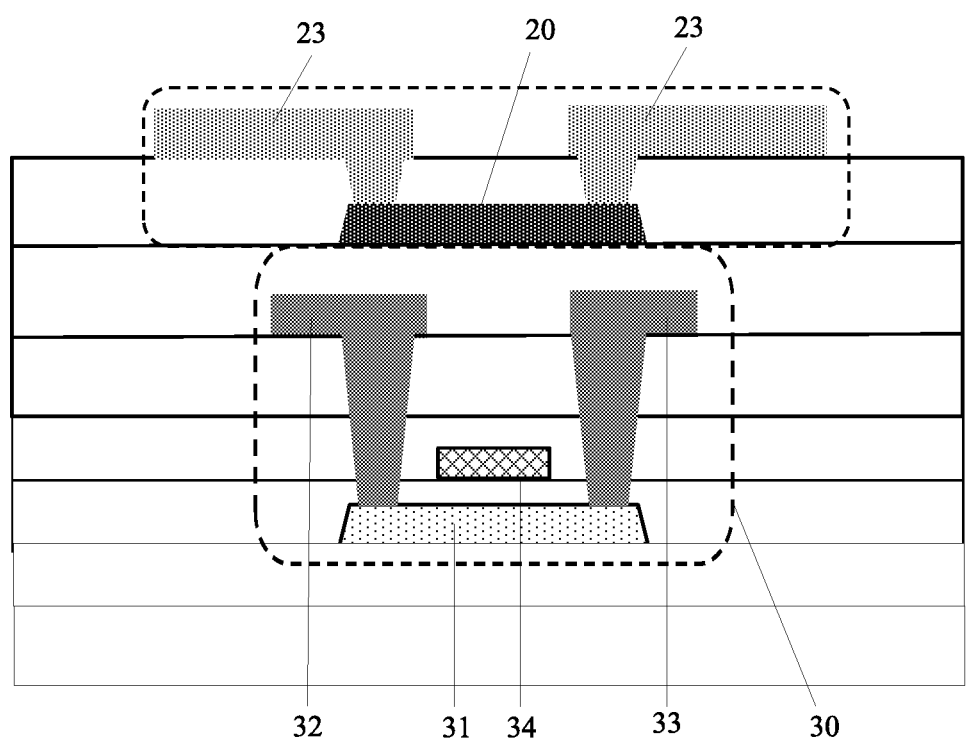
FIG. 18 is a partial section view of a position where a pressure detection element is arranged in a display panel according to another embodiment of the present disclosure.
Figure 19:
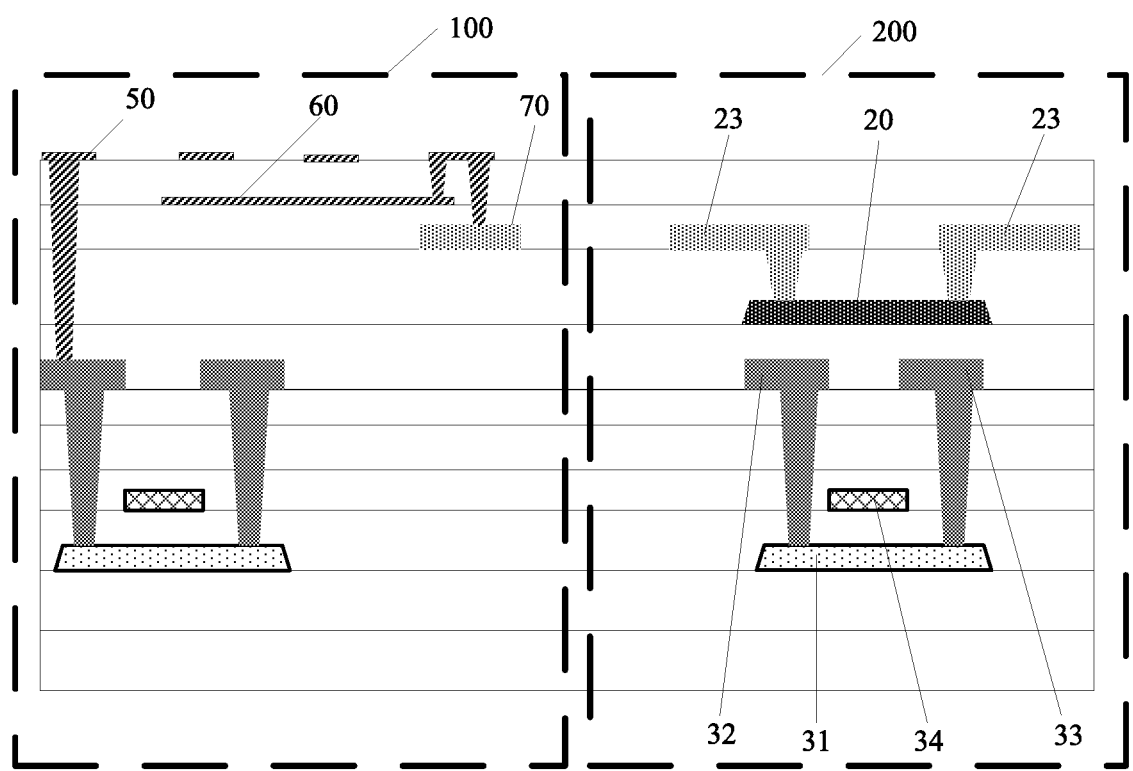
FIG. 19 is a partial section view of a display panel according to another embodiment of the present disclosure.

In one embodiment, in an embodiment of the present disclosure, as shown in FIG. 18 and FIG. 19, the border area 200 of the display panel further includes a third connection line 23 configured to provide a voltage signal to the pressure detection element 20. The third connection line 23 is arranged in a layer different from a layer where the first source 32 and the first drain 33 of the first thin film transistor 30 are arranged.

Based on the above embodiment, in an embodiment of the present disclosure, the display panel further includes a touch detection element. The touch detection element includes multiple touch electrodes configured to detect a touch signal in the display panel. In the embodiment, the third connection line and at least a part of the multiple touch electrodes are arranged in the same layer, which may prevent increase of the thickness of the display panel due to arrangement of the third connection line.

Based on the above embodiment, in an embodiment of the present disclosure, the touch detection of the display panel is a mutual capacitance touch detection. The multiple touch electrodes include multiple drive electrodes and multiple sense electrodes. The drive electrodes are arranged in a layer different from a layer where the sense electrodes are arranged. In the embodiment of the present disclosure, the third connection line and the drive electrodes are arranged in the same layer, or the third connection line and the sense electrodes are arranged in the same layer, which is not limited in the present disclosure. In other embodiments of the present disclosure, one part of the third connection line and the drive electrodes may be arranged in the same layer, and the other part of the third connection line and the sense electrodes may be arranged in the same layer, it depends on the actual requirements.

In another embodiment of the present disclosure, the touch detection of the display panel is a self-capacitance touch detection, and the multiple touch electrodes include multiple self-capacitance touch electrodes. In the embodiment of the present disclosure, the third connection line and the self-capacitance touch electrodes are arranged in the same layer.

It should be noted that, in any one of the above embodiments, the display panel may be an LCD display panel, or may be an OLED display panel, description is made as follows in conjunction with the different situations.

In the embodiment of the present disclosure, the display panel is an LCD display panel, as shown in FIG. 19, the display area 100 of the display panel further includes a common electrode layer and a pixel electrode layer. The pixel electrode layer includes multiple pixel electrodes 50. The pixel electrode 50 is electrically connected with the drain of the thin film transistor in the display area to transmit a data signal to the display unit. The common electrode layer includes multiple common electrodes 60 to provide a common voltage signal to each display unit.

It should be noted that, in the embodiment of the present disclosure, a first insulation layer is arranged between the common electrode layer and the pixel electrode layer to electrically insulate the common electrode 60 and the pixel electrode 50. It is not limited in the present disclosure, in other embodiments of the present disclosure, the common electrode layer and the pixel electrode layer may be arranged in the same layer, as long as the common electrode 60 and the pixel electrode 50 are electrically insulated.

It is also to be noted that, in the embodiment of the present disclosure, the display area of the display panel further includes multiple common electrode lines 70. The common electrode line 70 is electrically connected with the common electrode 60 to provide a common voltage signal to the common electrode. In one embodiment, in the embodiment of the present disclosure, a second insulation layer is arranged between the common electrode line 70 and the common electrode 60. The common electrode line 70 is electrically connected with the common electrode 60 via a cross-bridge. One end of the cross-bridge is electrically connected with the common electrode 60 via a via-hole arranged in the first insulation layer, and the other end of the cross-bridge is electrically connected with the common electrode line 70 via a via-hole penetrating through the first insulation layer and the second insulation layer.

In one embodiment, based on the above embodiment of the present disclosure, in an embodiment of the present disclosure, as shown in FIG. 19, the common electrode line 70 provides a common voltage signal to the common electrode 60 in a first time period, so that the common electrode 60 cooperates with the pixel electrode 50 to control the display unit to display. The common electrode line 70 provides a touch detection signal to the common electrode 60 in a second time period, to realize the touch detection by using the common electrode 60. In this way, the common electrode may further serve as the touch electrode, to reduce the thickness of the display panel with ensuring the display panel to have the touch function.

Based on the above embodiment, in an embodiment of the present disclosure, as shown in FIG. 19, the common electrode line 70 in the display area 100 and the third connection line 23 in the border area 200 are arranged in the same layer, to further reduce the thickness of the display panel.

In one embodiment, in an embodiment of the present disclosure, as shown in FIG. 18 and FIG. 19, in a case that a voltage signal is provided to the pressure detection element 20 via the third connection line 23 in the display panel, the third connection line 23 is directly electrically connected with the pressure detection element 20 via a via-hole, which is not limited in the present disclosure, and it depends on the actual requirements.

Figure 20:
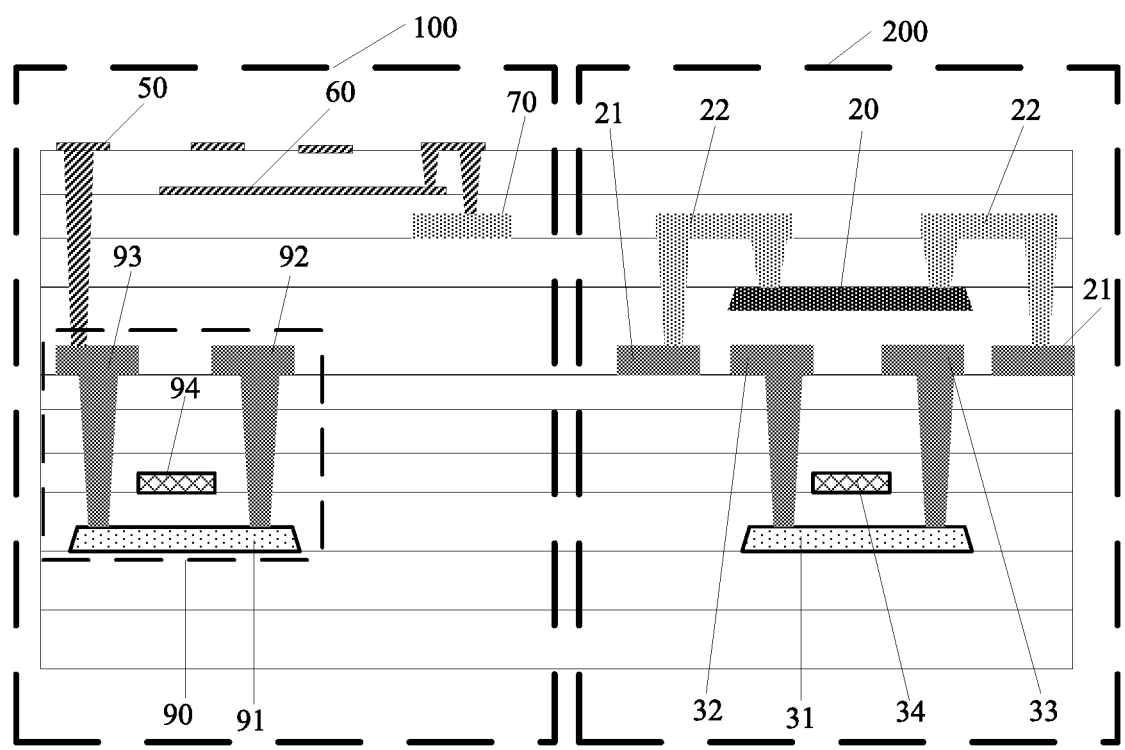
FIG. 20 is a partial section view of a display panel according to another embodiment of the present disclosure.

Based on any of the embodiments of the present disclosure, in an embodiment of the present disclosure, the display area includes a pixel circuit, the pixel circuit includes at least one second thin film transistor. As shown in FIG. 20, the second thin film transistor 90 includes a second channel layer 91, a second source 92, a second drain 93 and a second gate 94. The second source 92 and the second drain 93 are electrically connected with the second channel layer 91. The second gate 94 is configured to control a conduction state of the second channel layer 91. The second thin film transistor 90 is a polysilicon thin film transistor, that is, the second channel layer 91 is made of polysilicon. In one embodiment, in the embodiment of the present disclosure, the second channel layer 91 and the first channel layer 31 are arranged in the same layer. The second source 92, the second drain 93, the first source 32 and the first drain 33 are arranged in the same layer. The second gate 94 and the first gate 34 are arranged in the same layer, which may simplify the process of the display panel and reduce the thickness of the display panel.

Figure 21:
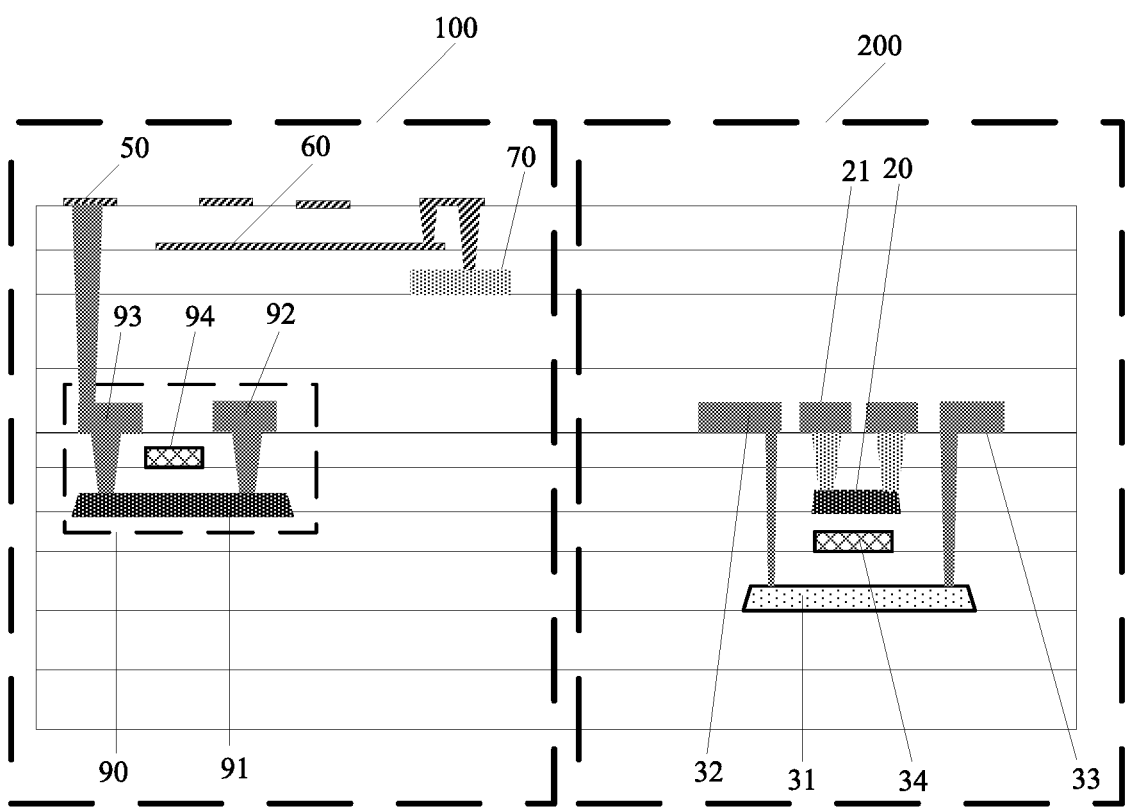
FIG. 21 is a partial section view of a display panel according to another embodiment of the present disclosure.

In another embodiment of the present disclosure, the display area includes a pixel circuit, as shown in FIG. 21, the pixel circuit includes at least one second thin film transistor 90. The second thin film transistor 90 includes a second channel layer 91, a second source 92, a second drain 93 and a second gate 94. The second source 92 and the second drain 93 are electrically connected with the second channel layer 91. The second gate 94 is configured to control a conduction state of the second channel layer 91. The second thin film transistor 90 is an oxide semiconductor thin film transistor, that is, the second channel layer 91 is made of oxide semiconductor, such as IGZO. In one embodiment, in the embodiment of the present disclosure, the second channel layer 91 and the pressure detection element 20 are arranged in the same layer. The second source 92, the second drain 93, the first source 32 and the first drain 33 are located in the same layer, which may simplify the process of the display panel and reduce the thickness of the display panel. It is not limited in the present disclosure, and it depends on the actual requirements. It should be understood that, in the embodiment of the present disclosure, an interlayer insulation layer is arranged between a layer where the second source 92 and the second drain 93 are arranged and a layer where the second gate 94 is arranged. A gate insulation layer is arranged between a layer where the second gate 94 is arranged and a layer where the second channel layer 91 is arranged. An interlayer insulation layer is arranged between a layer where the first gate 34 is arranged and a layer where the second channel layer 91 is arranged. A gate insulation layer is arranged between a layer where the first gate 34 is arranged and a layer where the first channel layer 31 is arranged.

Based on any of the above embodiments of the present disclosure, in an embodiment of the present disclosure, as shown in FIG. 2, each of the at least one pressure detection element 20 is arranged in at least one border area of a left border area or a right border area of the display panel.

Figure 22:
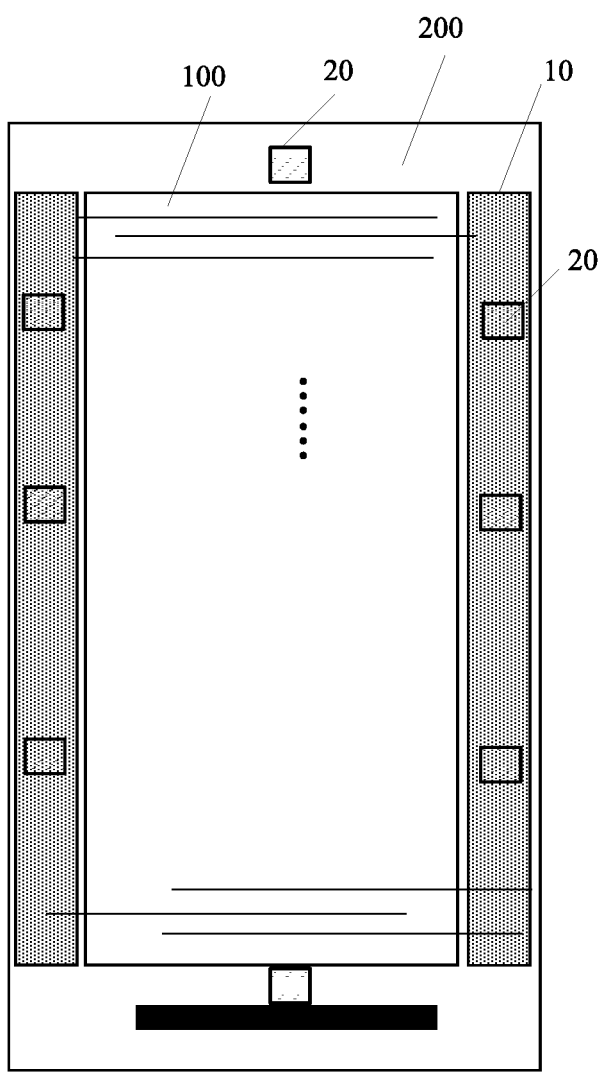
FIG. 22 is a schematic diagram shows an arrangement of pressure detection elements in a display panel according to an embodiment of the present disclosure.

In another embodiment of the present disclosure, as shown in FIG. 22, one part of the at least one pressure detection element 20 may be arranged in at least one border area of the left border area or the right border area of the display panel, and the other part of the at least one pressure detection element 20 may be arranged in at least one border area of an upper border area or a lower border area of the display panel, which may increase a change amount of a pressure signal detected in a center area of the display panel, to solve a problem of a weak detection signal in the center area of the display panel and may improve a pressure detection accuracy on the central area of the display panel.

Figure 23:
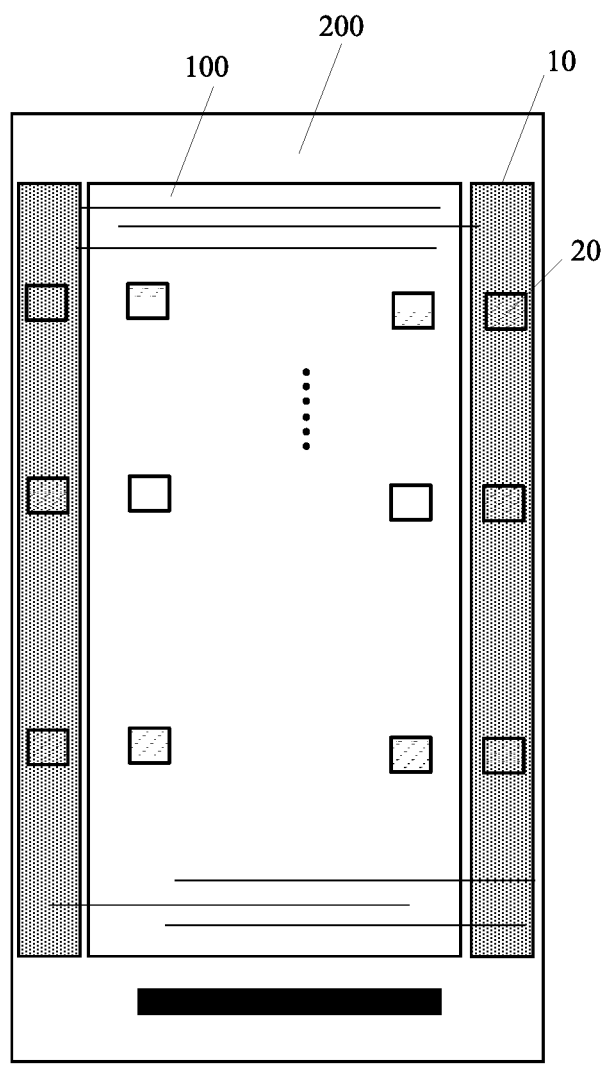
FIG. 23 is a schematic diagram shows an arrangement of pressure detection elements in a display panel according to another embodiment of the present disclosure.

In another embodiment of the present disclosure, as shown in FIG. 23, a part of the at least one pressure detection element may be arranged in the display area 100 of the display panel, which may improve a pressure detection accuracy on the display area of the display panel.

In one embodiment, only one of the at least pressure detection element is arranged in the upper border area of the display panel, and only one of the at least pressure detection element is arranged in the lower border area of the display pan. The display area of the display panel is bisected by a connection line between the pressure detection element in the upper border area of the display panel and the pressure detection element in the lower border area of the display panel. In this way, an accuracy uniformity of pressure detection in different areas of the display area of the display panel may be improved. It is not limited in the present disclosure, and it depends on the actual requirements.

Figure 24:
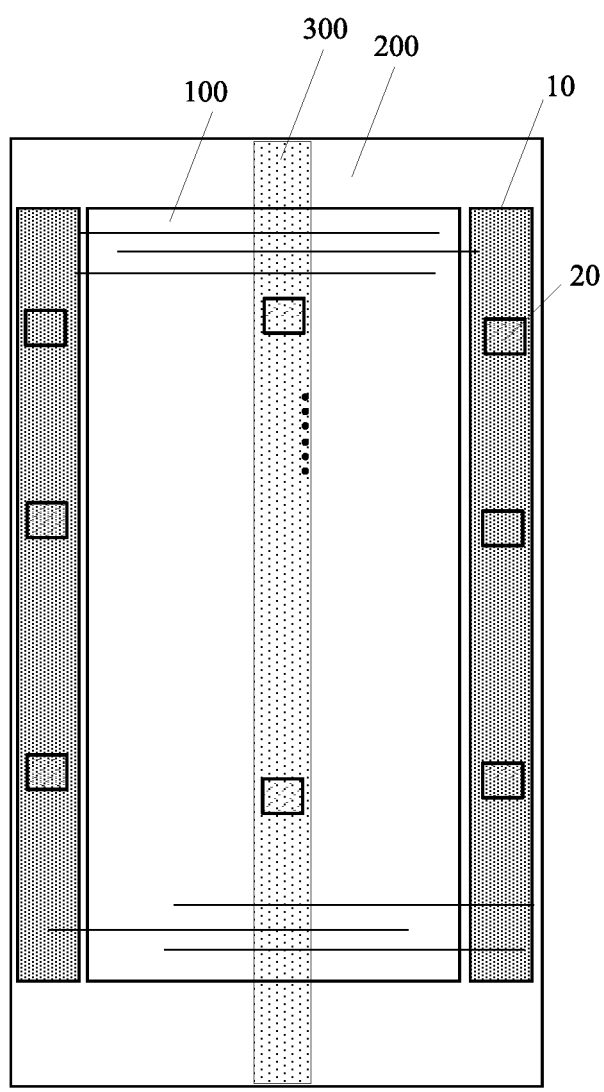
FIG. 24 is a schematic diagram shows an arrangement of pressure detection elements in a display panel according to an embodiment of the present disclosure.

Based on any of the above embodiments, in an embodiment of the present disclosure, if the display panel may be bended, as shown in FIG. 24, a part of the at least one pressure detection element 20 may be arranged in a bending area 300 of the display panel, which may improve an detection accuracy for a bending force in a bending area of display panel, and prevent a polysilicon layer in the polysilicon thin film transistor from cracking and being failed when the display panel is bended. It is not limited in the present disclosure, and it depends on the actual requirements.

In summary, in the display panel according to the embodiment of the present disclosure, the pressure detection element and the drive circuit are arranged in different layers. In a case that the pressure detection element is arranged in the border area of the display panel, the pressure detection element and the drive circuit may be arranged to be laminated, so that the display panel is integrated with a pressure detection function with reducing the impact of the arrangement of the pressure detection element on the width of the border area of the display panel. In this way, the border area of the display panel is quite narrow, which may adapt to the development trend of narrow bezel.

The embodiments in the specification are described in a progressive way, and each embodiment lays emphasis on differences from other embodiments. For the same or similar parts between various embodiments, one may refer to the description of other embodiments.

What is claimed is:

1. A display panel, comprising:
a display area comprising a plurality of display units; and
a border area comprising a drive circuit and at least one pressure detection element, wherein
the drive circuit is configured to provide a drive signal to the display units, the pressure detection element is arranged in a layer different from a layer where the drive circuit is arranged, and the pressure detection element is configured to detect a pressure signal in the display panel, and
the pressure detection element comprises at least one detection resistor, the detection resistor is arranged in a layer different from the layer where the drive circuit is arranged.

2. The display panel according to the claim 1, wherein a projection of the pressure detection element on a predetermined plane is at least partially overlapped with a projection of the drive circuit on the predetermined plane, the predetermined plane is parallel to a display surface of the display panel.

3. The display panel according to the claim 2, wherein the projection of the pressure detection element on the predetermined plane is within the projection of the drive circuit on the predetermined plane.

4. The display panel according to the claim 1, wherein the detection resistor has a square resistance of 1 kΩ to 4 kΩ, inclusive.

5. The display panel according to the claim 4, wherein the detection resistor is made of oxide semiconductor.

6. The display panel according to the claim 1, wherein
the drive circuit comprises a plurality of first thin film transistors;
each of the first thin film transistors comprises: a first channel layer, a first source and a first drain which are electrically connected with the first channel layer, and a first gate configured to control a conduction state of the first channel layer;
wherein the first channel layer is a polysilicon channel layer, and the pressure detection element is arranged on a side of the first source and the first drain which is away from the first channel layer.

7. The display panel according to the claim 6, further comprising:
a first connection line configured to provide a voltage signal to the pressure detection element, wherein the first connection line is arranged in a same layer with the first source or the first drain.

8. The display panel according to the claim 7, wherein
a projection of the pressure detection element on a predetermined plane is at least partially overlapped with a projection of the first connection line on the predetermined plane; and in an area of the pressure detection element and an area of the first connection line which are corresponding to an area where the projection of the pressure detection element on the predetermined plane is overlapped with the projection of the first connection line on the predetermined plane, the pressure detection element is directly electrically connected with the first connection line via a first via-hole.

9. The display panel according to the claim 7, further comprising:
a second connection line configured to electrically connect the first connection line with the pressure detection element;
wherein a first end of the second connection line is electrically connected with the first connection line via a second via-hole, and a second end of the second connection line is electrically connected with the pressure detection element via a third via-hole.

10. The display panel according to the claim 9, wherein the display area of the display panel further comprises:
a touch detection element comprising a plurality of touch electrodes configured to detect a touch signal in the display panel;
wherein the second connection line and at least a part of the plurality of touch electrodes are arranged in a same layer.

11. The display panel according to the claim 10, wherein the plurality of touch electrodes comprise a plurality of drive electrodes and a plurality of sense electrodes, the second connection line is arranged in a same layer with the drive electrodes or the sense electrodes; or the plurality of touch electrodes comprise a plurality of self-capacitance touch electrodes, the second connection line and the self-capacitance touch electrodes are arranged in a same layer.

12. The display panel according to claim 7, wherein
the drive circuit comprises a shift register circuit;
wherein the first connection line is configured to: provide the voltage signal to the pressure detection element in a first time period, and provide a control signal to the shift register circuit in a second time period.

13. The display panel according to the claim 6, wherein
the display area comprises a pixel circuit comprising at least one second thin film transistor;
wherein the second thin film transistor comprises a second channel layer, a second source and a second drain which are electrically connected with the second channel layer, and a second gate configured to control a conduction state of the second channel layer;
wherein the second thin film transistor is a polysilicon thin film transistor, and the second channel layer and the first channel layer are arranged in a same layer.

14. The display panel according to the claim 6, wherein
the display area comprises a pixel circuit comprising at least one second thin film transistor;
wherein the second thin film transistor comprises a second channel layer, a second source and a second drain which are electrically connected with the second channel layer, and a second gate configured to control a conduction state of the second channel layer;
wherein the second thin film transistor is an oxide semiconductor thin film transistor, and the second channel layer and the pressure detection element are arranged in a same layer.

15. The display panel according to the claim 1, wherein
the display area of the display panel further comprises a touch detection element comprising a plurality of touch electrodes configured to detect a touch signal in the display panel; and
the border area of the display panel further comprises a third connection line configured to provide a voltage signal to the pressure detection element;
wherein the third connection line and at least a part of the plurality of touch electrodes are arranged in a same layer.

* * * * *